United States Patent [19]

Awano et al.

[11] Patent Number: 5,610,412
[45] Date of Patent: Mar. 11, 1997

[54] SEMICONDUCTOR LIGHT EMITTING DEVICE WITH DEPLETION LAYER

[75] Inventors: Naomi Awano, Nagoya; Hajime Inuzuka, Nishio; Masahito Mizukoshi, Nagoya; Shigeki Kudomi, Ampachi-gun, all of Japan

[73] Assignee: Nippondenso Co., Ltd., Kariya, Japan

[21] Appl. No.: 545,224

[22] Filed: Oct. 19, 1995

[30] Foreign Application Priority Data

Oct. 19, 1994 [JP] Japan .................................. 6-253950

[51] Int. Cl.⁶ .................................................. H01L 33/00
[52] U.S. Cl. ............................. 257/85; 257/94; 257/95; 257/96; 257/97
[58] Field of Search ............................. 257/85, 84, 94, 257/95, 96, 97, 462, 98

[56] References Cited

U.S. PATENT DOCUMENTS 5,260,588  11/1993  Ohta et al. .......................... 257/95 X
5,408,105   4/1995  Adachi et al. ....................... 257/95 X

FOREIGN PATENT DOCUMENTS 62-143486   6/1987  Japan ................................. 257/95
 3-283676  12/1991  Japan .
 5-090638   4/1993  Japan .
 5-243612   9/1993  Japan .

OTHER PUBLICATIONS

Ishino et al: "Characterization of GaAs layer grown on Si substrates by MMBE", Applied Physics Society Advance Articles, Autumn 1987, p. 236, 20p–X–13.

*Primary Examiner*—William Mintel
*Attorney, Agent, or Firm*—Cushman, Darby & Cushman IP Group of Pillsbury Madison & Sutro LLP

[57] ABSTRACT

A semiconductor device having superior light output efficiency is disclosed. A p-Si diffusion layer is formed on a Si substrate and an n-Si diffusion layer is formed in the p-Si diffusion layer. An n-GaAs layer constituting an active region for emitting light is grown on the p-Si diffusion layer and the n-Si diffusion layer of the Si substrate and a p-GaAs layer constituting an active region for emitting light is grown on the n-GaAs layer. An upper electrode is disposed on an upper surface of the p-GaAs layer above the p-Si diffusion layer. Current is injected from the upper electrode through a region of the pn junction between the n-GaAs layer and the p-GaAs layer other than that directly below the upper electrode, and light is emitted from this region. The emitted light passes through the p-GaAs layer to outside the device without passing through and being attenuated by the upper electrode.

15 Claims, 4 Drawing Sheets

FIG. 5

SEMICONDUCTOR LIGHT EMITTING DEVICE WITH DEPLETION LAYER

CROSS REFERENCE TO RELATED APPLICATION

This application is based upon and claims the benefit of priority of the prior Japanese Patent application No. 6-253950 filed on Oct. 19, 1994, the contents of which are incorporated herein by reference.

BACKGROUND OF THE INVENTION

1. Field of the Invention

This invention relates to a semiconductor device, and particularly to a light emitting device disposed on a semiconductor monocrystalline substrate by way of a heterojunction.

2. Related Arts

Conventionally, in a discrete ordinary light emitting diode of the kind seen in a GaAs light emitting diode made by homoepitaxial growth on a GaAs substrate (that is, a GaAs light emitting diode wherein an n-GaAs layer and a p-GaAs layer are consecutively formed by crystal growth on a GaAs substrate and an upper electrode is locally disposed on the upper surface of the GaAs layers), to improve the light output efficiency the following kinds of method have been being used: (1) To cause current to flow through a large region of a pn junction surface and cause light to be emitted from a large region of the pn junction surface, the film thickness of operating layers of the diode are made large and the electrical field inside the diode is extended in the transverse direction. (2) To avoid blocking of light by an upper electrode, the upper electrode and a lower electrode of the diode are disposed offset from each other, current in operating layers is made to flow diagonally and a pn junction portion directly below the upper electrode is not made a light emitting region (for example the structure disclosed in Japanese Laid-Open Patent Publication No. H5-90638).

However, when this technology is used in a light emitting diode in which a monolithic structure has been adopted with the purpose of integrating constant voltage circuits and signal processing circuits and the like, that is, when a light emitting diode is formed by consecutively forming an n-GaAs layer and a p-GaAs layer on an Si substrate by crystal growth, it is known that when a GaAs crystal of over 5 µm is grown, because the thermal expansivities of Si and GaAs are different, cracks occur (Autumn 1987, Applied Physics Society Advance Articles page 236, 20p-X-13; Characterization of GaAs Layer Grown on Si Substrates by MBE; Ishino et al. ). Consequently, it is necessary to keep the thickness of a GaAs light emitting diode (the thickness of the n-GaAs layer and the p-GaAs layer) below 5 µm. However, in a light emitting diode made with a normal film thickness, current only flows substantially directly below the electrode. That is, in a light emitting diode in which an upper electrode is locally disposed on the upper surface of a GaAs layer, because current only flows directly below the upper electrode it is necessary for light to be outputted through the upper electrode and the efficiency with which the light is outputted to the outside has consequently been low.

Also, with this structure (a structure comprising a laminate of an n-GaAs layer and a p-GaAs layer on an Si substrate), it is not possible to form a lower electrode directly on the diode (the laminate of GaAs layers), and consequently it is not possible to output light to the outside without suffering a blocking influence (influence attenuating the light) caused by the upper electrode by offsetting the positions of the upper electrode and the lower electrode.

As technology devised in view of this problem, there is a light emitting diode disclosed in Japanese Laid-Open Patent Publication No. H3-283676. This has a current blocking layer disposed between a double-hetero structure part and a substrate for preventing current from flowing to a region located below an upper first electrode.

That is, when an n-type InGaAlP cladding layer and a p-type current blocking layer are joined, a depletion layer determined by a diffusion potential and impurity concentrations of the two layers is formed at their interface. The current blocking layer blocks current by utilizing a pn diode constituted by these two layers becoming reverse biased.

However, in the light emitting diode disclosed in Japanese Laid-Open Patent Publication No. H3-283676, the impurity concentration of the n-type InGaAlP cladding layer is set high with the object of injecting carriers. Consequently, the depletion layer formed between the n-type InGaAlP cladding layer and the current blocking layer does not readily extend to the n-type InGaAlP cladding layer side, and there is the problem that it is not possible efficiently to block current flowing within the device.

Here, to increase the spread of the depletion layer to the n-type InGaAlP cladding layer side, it is conceivable to make the impurity concentration of the current blocking layer high also; however, in this case, the tunnel effect becomes great and as a result it is not possible to block current efficiently.

SUMMARY OF THE INVENTION

Accordingly, it is an object of this invention to obtain a semiconductor device with which it is possible to block a current channel efficiently and thereby obtain efficient light emission.

To achieve this object and other objects, the invention provides a semiconductor device comprising: a semiconductor monocrystalline substrate having a first conductivity type region of a first conductivity type which becomes a current channel forming region; a first semiconductor layer of the first conductivity type made of a material different from that of the semiconductor monocrystalline substrate and so disposed on the semiconductor monocrystalline substrate as to make contact with both the first conductivity type region and another region of the semiconductor monocrystalline substrate; a second semiconductor layer of a second conductivity type made of the same material as the first semiconductor layer and disposed on the first semiconductor layer, the first semiconductor layer and the second semiconductor layer forming an active region for emitting light; and an electrode disposed on an upper surface of the second semiconductor layer above a region of the semiconductor monocrystalline substrate other than the first conductivity type region, wherein a potential for extending a depletion layer to the first semiconductor layer side is applied to the region of the semiconductor monocrystalline substrate other than the first conductivity type region.

According to the present invention, a heterojunction is formed between a semiconductor monocrystalline substrate and a first semiconductor layer. Also, a junction part between a first conductivity type region of the semiconductor monocrystalline substrate and the first semiconductor layer becomes a current passing region and an electrode is disposed on an upper surface of a second semiconductor layer above a region of the semiconductor monocrystalline substrate other than the first conductivity type region. This electrode and the current passing region are disposed in positions offset from each other in the transverse direction.

Current flows diagonally through the first semiconductor layer and the second semiconductor layer from the electrode toward the current passing region (or current flows diagonally from the current passing region toward the electrode) and light is emitted from a pn junction interface between the second semiconductor layer and the first semiconductor layer. This light emitting region is not directly below the electrode but is in a position offset from directly below the electrode. The emitted light is emitted to the outside through the second semiconductor layer. At this time, because there is no electrode directly above the light emitting region, the light is emitted to the outside without being blocked by the electrode.

As a result it is possible to output light to the outside without the light being attenuated by the electrode, and the diode has excellent light output efficiency.

According to another aspect of the invention, the semiconductor monocrystalline substrate is made of Si, the carrier concentration of the first conductivity type region is $1\times10^{20}$ cm$^{-3}$ or more and the first semiconductor layer is made of GaAs and has a carrier concentration of $1\times10^{17}$ cm$^{-3}$ or more, and as a result the junction surface of the first conductivity type region and the first semiconductor layer has ohmic characteristics.

Also, a potential is applied to a region other than the first conductivity type region in the semiconductor monocrystalline substrate so that a depletion layer extends from where this region makes contact with the first semiconductor layer to inside the first semiconductor layer. This depletion layer pushes up the injection current channel and makes it easy for current to be injected into the pn junction interface other than directly below the electrode.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A first preferred embodiment of the invention applied to a GaAs light emitting diode will now be described with reference to the accompanying drawings.

Figure 1:
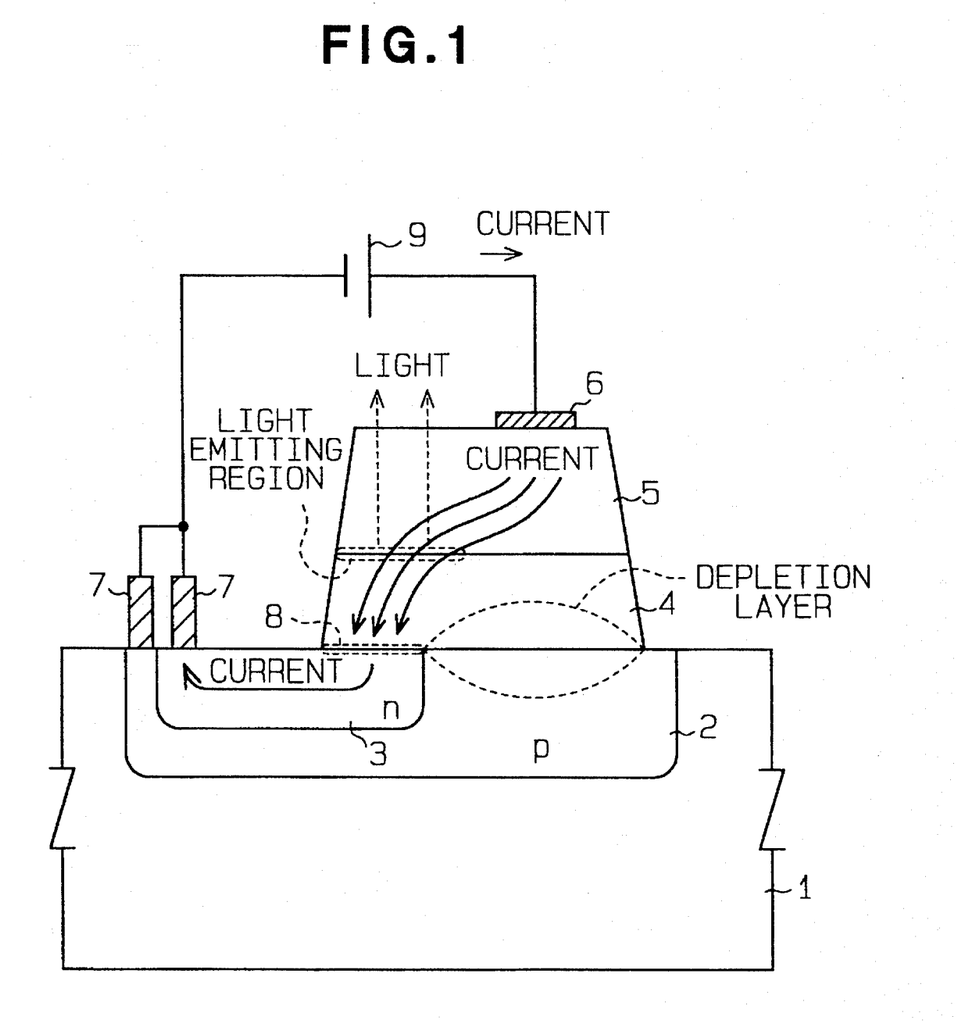
FIG. 1 is a sectional view of a semiconductor device of a first preferred embodiment of the present invention.

As shown in FIG. 1, a p-Si diffusion layer 2 is formed in a Si substrate 1 as a semiconductor monocrystalline substrate, and an n-Si diffusion layer 3 constituting a current channel forming region is formed in the p-Si diffusion layer 2 by photolithography. The carrier density of the n-Si diffusion layer 3 is $1\times10^{20}$ cm$^{-3}$ or more. The p-Si diffusion layer 2 is provided to isolate the n-Si diffusion layer 3 in the Si substrate 1 and for forming a depletion layer which will be further discussed later, and is formed before the n-Si diffusion layer 3 is formed.

An n-GaAs layer 4 and a p-GaAs layer 5 constituting light emitting diode operating layers (active regions for emitting light) are successively formed by crystal growth on the surface of the Si substrate 1. This n-GaAs layer 4 is formed on upper surfaces of regions of the p-Si diffusion layer 2 and the n-Si diffusion layer 3, and the n-GaAs layer 4 makes contact with both the p-Si diffusion layer 2 and the n-Si diffusion layer 3.

As a result, the junction surface of the n-Si diffusion layer 3 and the n-GaAs layer 4 is a heterojunction. The carrier density of the n-GaAs layer 4 is $1\times10^{17}$ cm$^{-3}$ or more. In this way, by the carrier densities of the n-GaAs and the n-Si being made $1\times10^{17}$ cm$^{-3}$ or more and $1\times10^{20}$ cm$^{-3}$ or more, respectively, ohmic characteristics are obtained at the junction surface of the n-Si diffusion layer 3 and the n-GaAs layer 4 and this junction surface becomes an ohmic electrode.

Explaining this in further detail, by the carrier densities of the n-GaAs and the n-Si diffusion layer being prescribed (n-GaAs: $1\times10^{17}$ cm$^{-3}$ or more, n-Si: $1\times10^{20}$ cm$^{-3}$ or more), the thickness of the barrier at the n-GaAs/n-Si heterojunction interface is made thin and ohmic characteristics are obtained by the tunnel effect. This ohmic electrode constitutes a lower electrode 8, and current is discharged through this lower electrode 8 to the n-Si diffusion layer 3 constituting the current channel forming region. Thus the lower electrode 8 is also a current passing region.

The thickness of the n-GaAs layers 4 and 5 is 5 μm or thinner to prevent cracking.

An upper electrode 6 of the diode is formed on the upper surface of the p-GaAs layer 5 above the p-Si diffusion layer 2; this upper electrode 6 is made of an AuZn film, and the film thickness is about 300 nm. This upper electrode 6 and the lower electrode (ohmic electrode) 8 are disposed in horizontally offset positions. That is, when the diode is viewed from directly above, the upper electrode 6 and the lower electrode 8 are in a non-overlapping positional relationship.

The position of the lower electrode 8 can be freely set by changing the position of patterning of the n-Si diffusion layer 3.

An Al electrode 7 for taking out current is formed on a region of the upper surface of the n-Si diffusion layer 3 other than the region where the n-GaAs layer 4 is disposed. The Al electrode 7 also contacts with the p-Si diffusion layer 2. A direct current power source 9 is connected between the upper electrode 6 and the Al electrode 7, a plus potential is applied to the upper electrode 6 side and a minus potential is applied to the Al electrode 7 side. As a result, a forward bias is applied to the pn junction between the p-GaAs layer 5 and the n-GaAs layer 4.

Next, the operation of the semiconductor device thus constructed will be described.

By a plus potential being applied to the p-GaAs layer 5 side and a minus potential being applied to the n-GaAs layer 4 side by the direct current power source 9, a forward bias is applied to the pn junction in the GaAs. When this happens, current from the direct current power source 9 flows toward the upper electrode 6, and current injected into the upper electrode 6 flows diagonally from the upper electrode 6 through the p-GaAs layer 5 and the n-GaAs layer 4 toward the lower electrode 8.

Current flows through a part of the pn junction surface between the p-GaAs layer 5 and the n-GaAs layer 4 other than that which is directly below the upper electrode 6, and light is emitted from this pn junction part. That is, a region of the GaAs pn junction surface other than that directly below the upper electrode 6 becomes a light emitting region. This light is emitted upward through the p-GaAs layer 5 to outside the device (the diode). When the light arrives at the outside, because there is no upper electrode 6 directly above the light emitting region, the light is emitted to the outside without being blocked by the upper electrode 6. In this way, attenuation of the light by the upper electrode 6 is suppressed as much as possible.

Also, at this time, focusing on the area where the n-GaAs layer 4 and the p-Si diffusion layer 2 are in contact, a pn junction is formed in this area. From the bias conditions of the operation of the light emitting diode (a plus potential applied to the upper electrode 6 and a minus potential applied to the Al electrode 7), a reverse bias is applied to the pn junction between the n-GaAs layer 4 and the p-Si diffusion layer 2. As a result, a depletion layer is formed at this pn junction, and the depletion layer extends from the interface between the n-GaAs layer 4 and the p-Si diffusion layer 2 into inside the n-GaAs layer 4 and the p-Si diffusion layer 2. This depletion layer formed inside the n-GaAs layer 4 pushes up the current channel inside the diode and makes it easy for current to be injected into the pn junction surface of the diode not directly below the upper electrode 6.

Current having passed through the pn junction between the p-GaAs layer 5 and the n-GaAs layer 4 passes through the n-GaAs layer 4, reaches the n-Si diffusion layer 3 and passes through the Al electrode 7.

Thus, in this preferred embodiment, there are provided the Si substrate 1 (semiconductor monocrystalline substrate) having the n-Si diffusion layer 3 (first conductivity type region) which becomes a current channel forming region, the n-GaAs layer 4 (first conductivity type semiconductor) constituting an active region for emitting light made of a different material from the Si substrate 1 and in contact with both the n-Si diffusion layer 3 of the Si substrate 1 and another region thereof, the p-GaAs layer 5 (second conductivity type semiconductor) constituting an active region for emitting light made of the same material as the n-GaAs layer 4 and the upper electrode 6 disposed on the upper surface of the p-GaAs layer 5 above a region of the Si substrate 1 other than the n-Si diffusion layer 3.

As a result, the Si substrate 1 and the n-GaAs layer 4 form a heterojunction. Also, the junction of the n-Si diffusion layer 3 of the Si substrate 1 and the n-GaAs layer 4 constitutes a current passing region and the upper electrode 6 is disposed on the upper surface of the p-GaAs layer 5 above a region of the Si substrate 1 other than the n-Si diffusion layer 3. The upper electrode 6 and the current channel forming region are disposed in transversely offset positions. Current flows diagonally from the upper electrode 6 through the p-GaAs layer 5 and the n-GaAs layer 4 toward the current channel-forming region, and light is emitted at the pn junction surface of the p-GaAs layer 5 and the n-GaAs layer 4. This light emitting region is not directly below the upper electrode 6 and is offset from directly below where the electrode is disposed. The emitted light is emitted through the p-GaAs layer 5 to the outside. At this time, because there is no upper electrode 6 directly above the light emitting region, light is emitted to the outside without being blocked by the upper electrode 6. As a result, the light can be outputted to the outside without being attenuated by the upper electrode 6, and the light output efficiency is excellent.

Also, as a result of the carrier density of the n-Si diffusion layer 3 of the Si substrate 1 being made $1 \times 10^{20}$ cm$^{-3}$ or more and the carrier density of the n-GaAs layer 4 being made $1 \times 10^{17}$ cm$^{-3}$ or more, the junction surface between the n-Si diffusion layer 3 of the Si substrate 1 and the n-GaAs layer 4 has ohmic characteristics. Consequently, the junction surface between the n-Si diffusion layer 3 of the Si substrate 1 and the n-GaAs layer 4 becomes an ohmic electrode, and this becomes the lower electrode 8 opposing the upper electrode 6. As a result, the resistance value in the current passing region is extremely small and the device characteristics are excellent. That is, the GaAs/Si junction below the electrode on the surface of the light emitting diode is made an aniso-type heterojunction, current flow through the GaAs-pn junction part directly below the electrode is controlled, light is emitted from a region other than directly below the electrode and light absorption by the electrode is prevented.

Furthermore, the p-Si diffusion layer 2 (second conductivity type region) is formed in the Si substrate 1, the n-Si diffusion layer 3 is formed inside this p-Si diffusion layer 2, the p-Si diffusion layer 2 makes contact with the n-GaAs layer 4 and the upper electrode 6 is disposed above the p-Si diffusion layer 2. Consequently, the junction between the p-Si diffusion layer 2 of the Si substrate 1 and the n-GaAs layer 4 becomes a pn junction part, and by a reverse bias being applied a depletion layer is formed in this region. This depletion layer pushes up the channel of injected current and makes it easy for current to be injected into the pn junction surface other than directly below the upper electrode 6.

The semiconductor films grown on the Si substrate 1 may be semiconductor films of various types such as GaP or GaAlAs or InP instead of GaAs.

Also, although in the example described above the conductivity types were those of the n-Si diffusion layer 3 on the substrate side, the n-GaAs layer 4 and the p-GaAs layer 5, these conductivity types may be reversed. That is, a p-GaAs layer and an n-GaAs layer may be consecutively grown on a substrate side p-Si diffusion layer. In this case, current flows diagonally from the lower electrode (current passing region) 8 toward the upper electrode 6.

Also, to improve the crystallinity of the GaAs a distortion superlattice or the like may be inserted on the Si substrate side in the vicinity of the operating layer. That is, a distortion superlattice or the like may be inserted at least either on the n-GaAs layer 4 side in FIG. 1 or on the p-GaAs layer 5 side when the conductivity types have been reversed.

(Second Embodiment)

A second preferred embodiment of the invention will now be described centering on points of difference from the first preferred embodiment.

A semiconductor device according to the second embodiment is shown in FIGS. 2, 3, 4 and 5. Although the above first embodiment shows a discrete light emitting diode of GaAs formed on a Si substrate, this second preferred embodiment shows a light integrated circuit such as monolithic photocoupler.

Figure 2:
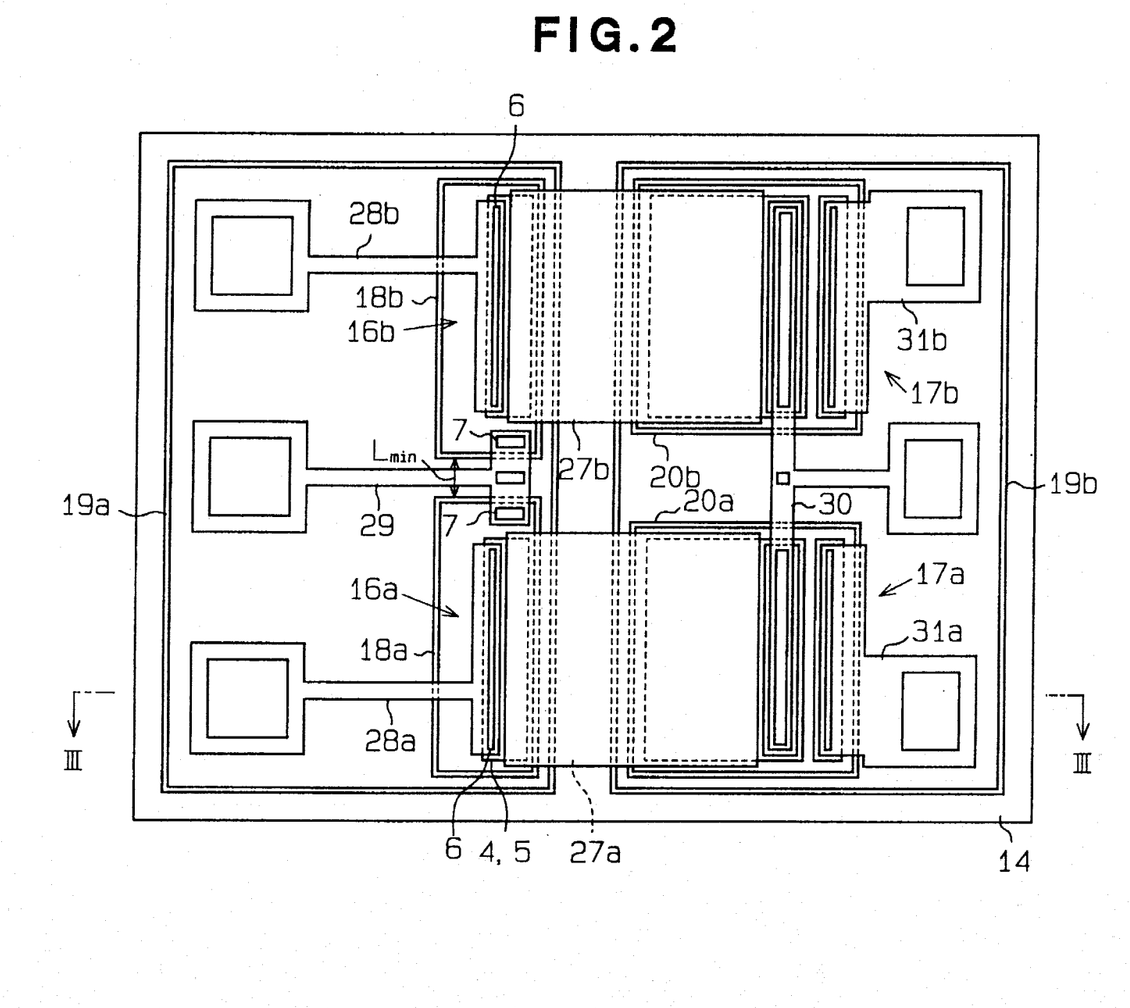
FIG. 2 is a plan view of a semiconductor device of a second preferred embodiment of the present invention.
Figure 3:
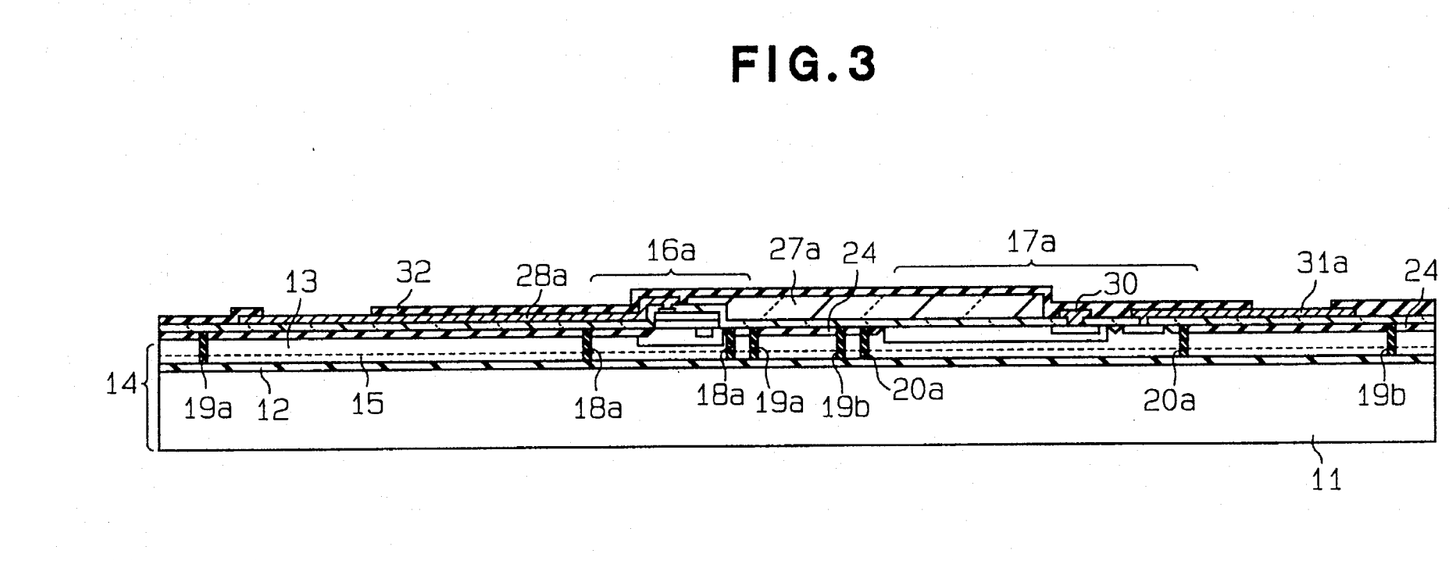
FIG. 3 is a sectional view on the line III—III in FIG. 2.
Figure 4:
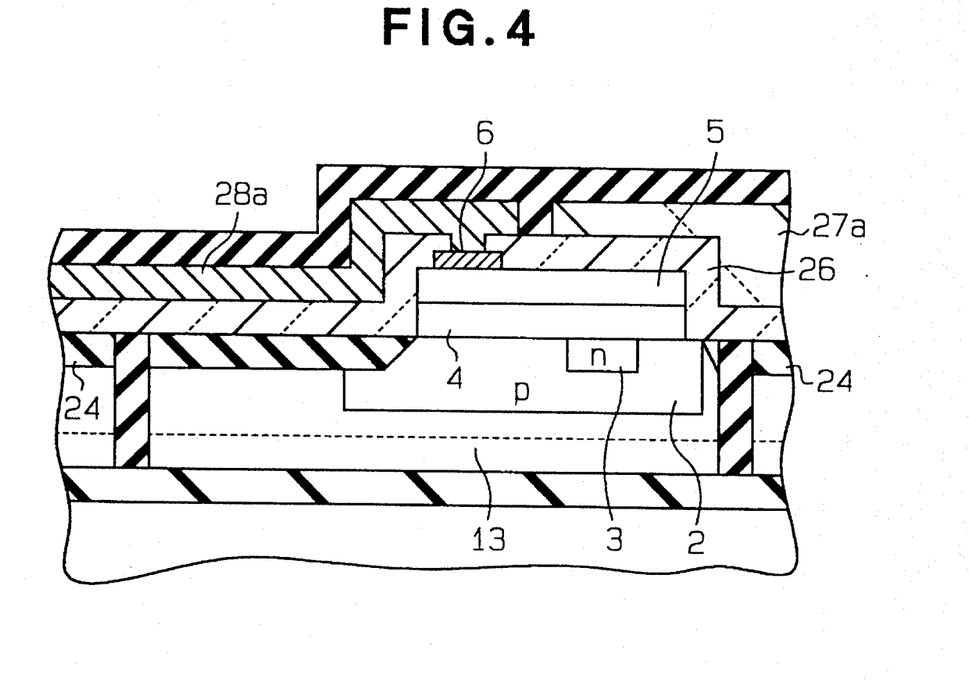
FIG. 4 is an enlarged sectional view of a light emitting diode part.
Figure 5:
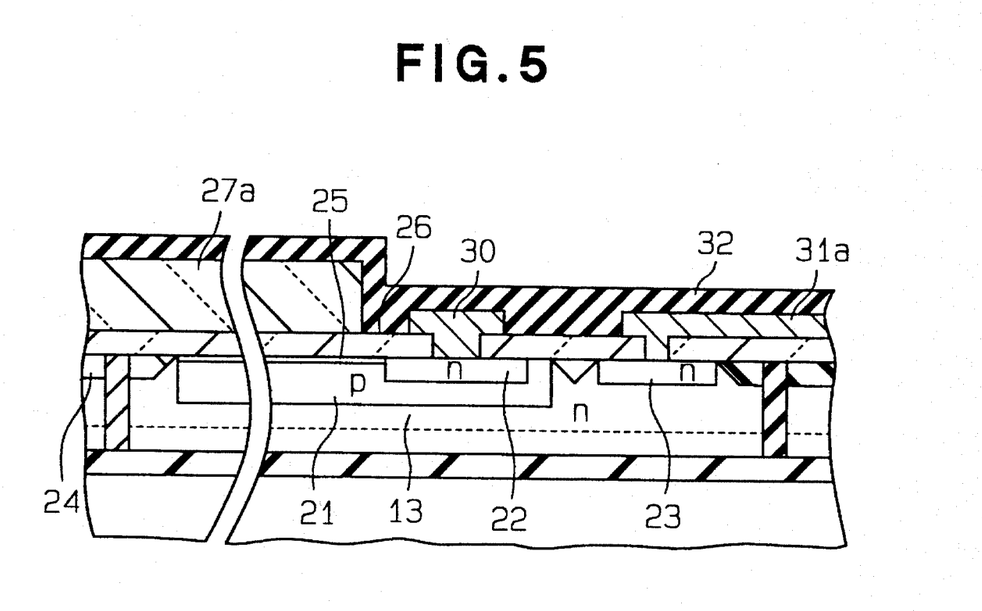
FIG. 5 is an enlarged sectional view of a phototransistor part.

FIG. 2 is plan view, FIG. 3 is a sectional view on the line III—III in FIG. 2, FIG. 4 is an enlarged view of a light emitting device part (light emitting diode part) and FIG. 5 is an enlarged view of a light-receiving device part (phototransistor part).

As shown in FIG. 3, a monocrystalline Si layer 13 is formed on an SiO₂ layer 12 formed on a support substrate 11. The support substrate 11, the SiO₂ layer 12 and the monocrystalline Si layer 13 constitute an SOI substrate 14. A high density diffusion layer 15 is formed in the bottom of the monocrystalline Si layer 13.

As shown in FIG. 2 and FIG. 3, GaAs light emitting diode parts 16a, 16b are formed on the monocrystalline Si layer 13 in the SOI substrate 14, and phototransistor parts 17a, 17b using Si are formed inside the monocrystalline Si layer 13 in the SOI substrate 14. That is, a photocoupler consisting of the light emitting diode part 16a and the phototransistor part 17a and a photocoupler consisting of the light emitting diode part 16b and the phototransistor part 17b are formed in the SOI substrate 14, and photocouplers of two channels are thus disposed in the same substrate.

An SiO₂ layer forming groove reaching the SiO₂ layer 12 is formed around the light emitting diode part 16a in the monocrystalline Si layer 13, and an SiO₂ layer 18a is filled in this groove. Similarly, an SiO₂ layer forming groove reaching the SiO₂ layer 12 is formed around the light emitting diode part 16b in the monocrystalline Si layer 13, and an SiO₂ layer 18b is filled in this groove. An SiO₂ layer forming groove reaching the SiO₂ layer 12 is formed around the phototransistor part 17a in the monocrystalline Si layer 13, and an SiO₂ layer 20a is filled in this groove. Similarly, an SiO₂ layer forming groove reaching the SiO₂ layer 12 is formed around the phototransistor part 17b in the monocrystalline Si layer 13 and an SiO₂ layer 20b is filled in this groove.

The SiO₂ layers 18a, 18b, 20a, 20b are of a lower optical refractive index and reflect light more than the monocrystalline Si layer 13 (semiconductor monocrystalline region). Also, the SiO₂ layers 18a, 18b, 20a, 20b are formed between the two channels and the shortest distance $L_{min}$ (shown in FIG. 2) between the two channels is above an attenuation length $L_A$ given by the expression:

$$L_A = WL/(4\pi \times K)$$

wherein WL is a light emission wavelength of LED and K is an attenuation coefficient of light absorbing material.

Light is confined in the light emitting diode part 16a by the SiO₂ layer 18a, and light is confined in the light emitting diode part 16b by the SiO₂ layer 18b. Also, light is confined in the phototransistor part 17a by the SiO₂ layer 20a, and light is confined in the phototransistor part 17b by the SiO₂ layer 20b. In this way, crosstalk between the channels is prevented by the SiO₂ layers 18a, 18b, 20a, 20b formed in the monocrystalline Si layer 13 (semiconductor monocrystalline region).

For the SiO₂ layers 18a, 18b, 20a, 20b serving as light-confining layers (light reflecting layers), silica glass may alternatively be used or they may consist of empty gaps with nothing being disposed in the grooves.

Also, an SiO₂ layer forming groove reaching the SiO₂ layer 12 is formed around the light emitting diode parts 16a, 16b (around the SiO₂ layers 18a and 18b) in the monocrystalline Si layer 13, and an SiO₂ layer 19a is filled in this groove. Similarly, an SiO₂ forming groove reaching the SiO₂ layer 12 is formed around the phototransistor parts 17a, 17b (around the SiO₂ layers 20a and 20b) in the monocrystalline Si layer 13, and an SiO₂ layer 19b is filled in this groove. The light emitting diode parts 16a, 16b and the phototransistor parts 17a, 17b are electrically isolated by the SiO₂ layers 19a, 19b in the monocrystalline Si layer 13 (semiconductor monocrystalline region) and the SiO₂ layer 12.

For the SiO₂ layers 19a, 19b serving as electrical isolation films, silica glass may alternatively be used. The thermal expansivity of the SiO₂ layers 18a, 18b, 20a, 20b is close to the thermal expansivity of the monocrystalline Si layer 13 (semiconductor monocrystalline region), and the stress exerted on the monocrystalline Si layer 13 by these SiO₂ layers is moderated.

In the light emitting diode part shown in FIG. 4, a p-Si diffusion layer 2 is formed in the monocrystalline Si layer 13, and an n-Si diffusion layer 3 is formed inside this p-Si diffusion layer 2. An n-GaAs layer 4 and a p-GaAs layer 5 are sequentially formed by crystal growth on the upper surface of the p-Si diffusion layer 2 and the n-Si diffusion layer 3. A upper electrode 6 is formed on the upper surface of the p-GaAs layer 5 in a position offset from above the n-Si diffusion layer 3. The upper electrode 6 is an AuZn film.

An Al electrode 7 (shown in FIG. 2) for taking out current is formed on a region of the upper surface of the n-Si diffusion layer 3 other than the region where the n-GaAs layer 4 is disposed.

In a phototransistor part shown in FIG. 5, the monocrystalline Si layer 13 is n-type, a p-type base region 21 is formed in a predetermined region in the upper surface part of the monocrystalline Si layer 13 and an n-type emitter region 22 is formed in the upper surface part of the p-type base region 21. Also, an n-type diffusion region 23 is formed in a predetermined region in the upper surface part of the monocrystalline Si layer 13. An n/p/n-structure phototransistor is formed by the n-type emitter region 22, the p-type base region 21 and the n-type monocrystalline Si layer 13.

A field oxide film (SiO₂ film) 24 is formed on the surface of the SOI substrate 14, and this film 24 is of a thickness necessary for it to serve as a cladding layer (light reflecting layer) of a light waveguide path which will be further discussed later. A thin SiO₂ film 25 is formed on the upper surface of the p-type base region 21.

A silicon nitride film 26 is formed on the field oxide film (SiO₂ film) 24, on the SiO₂ film 25 and on the n-GaAs layer 4/p-GaAs layer 5 stack. A titanium oxide layer 27a is formed as a light waveguide path forming member on the silicon nitride film 26 between the light emitting diode part 16a and the phototransistor part 17a, and the phototransistor part 17a and the light emitting diode part 16a are optically connected by this titanium oxide layer 27a. Similarly, a titanium oxide layer 27b is formed as a light waveguide path forming member on the silicon nitride film 26 between the light emitting diode part 16b and the phototransistor part 17b, and the light emitting diode part 16b and the phototransistor part 17b are optically connected by this titanium oxide layer 27b.

Here, the titanium oxide layers 27a, 27b serving as light waveguide path forming members are made of a transparent material whose optical refractive index at the wavelength of light emitted by a GaAs light emitting diode is greater than 1.

The titanium oxide layers 27a, 27b serving as light waveguide path forming members may alternatively be made of silicon nitride ($Si_3N_4$) or arsenic glass ($As_2Se_3$, $As_2S_3$).

As shown in FIG. 2 and FIG. 3, in the light emitting diode part 16a, an Al interconnector 28a is formed on the silicon nitride film 26, the Al interconnector 28a is connected to the upper electrode 6 of the light emitting diode part 16a and extends into a region outside the SiO₂ layer 18a but inside the SiO₂ layer 19a. As shown in FIG. 2, in the light emitting diode part 16b, an Al interconnector 28b is formed on the silicon nitride film 26, the Al interconnector 28b is connected to the upper electrode 6 of the light emitting diode part 16b and extends into a region outside the SiO$_2$ layer 18b but inside the SiO$_2$ layer 19a. Also, as shown in FIG. 2, in the light emitting diode parts 16a, 16b, an Al interconnector 29 is formed on the silicon nitride film 26; the Al interconnector 29 is formed integrally with the Al electrodes 7 of the two light emitting diode parts 16a, 16b and extends into a region outside the SiO$_2$ layers 18a and 18b but inside the SiO$_2$ layer 19a.

As shown in FIG. 2 and FIG. 3, in the phototransistor parts 17a, 17b, an Al interconnector 30 is formed on the silicon nitride film 26, the Al interconnector 30 makes contact with the n-type emitter regions 22 in the phototransistor parts 17a, 17b and extends into a region outside the SiO$_2$ layers 20a and 20b but inside the SiO$_2$ layer 19b. As shown in FIG. 2 and FIG. 3, in the phototransistor part 17a, an Al interconnector 31a is formed on the silicon nitride film 26, the Al interconnector 31a makes contact with the n-type diffusion region 23 of the phototransistor part 17a and extends into a region outside the SiO$_2$ layer 20a but inside the SiO$_2$ layer 19b. Also, as shown in FIG. 2, in the phototransistor part 17b, an Al interconnector 31b is formed on the silicon nitride film 26, the Al interconnector 31b makes contact with the n-type diffusion region 23 of the phototransistor part 17b and extends into a region outside the SiO$_2$ layer 20b but inside the SiO$_2$ layer 19b.

The surfaces of the light emitting diode parts 16a, 16b and the phototransistor parts 17a, 17b are covered by a SiO$_2$ film 32, and parts of the SiO$_2$ film 32 on the Al interconnectors 28a, 28b, 29, 30, 31a and 31b are open and serve as bonding pad parts.

The operation of the semiconductor device thus constructed is that when a voltage is impressed across the upper electrode 6 and the Al electrode 7 in each of the light emitting diode parts 16a, 16b a current flows from the upper electrode 6 diagonally through the inside of the diode part, light is emitted from a pn junction part not directly below the upper electrode 6, and this light passes upward through the p-GaAs layer 5 and into the titanium oxide layers 27a, 27b. This light further propagates through the insides of the titanium oxide layers 27a, 27b and reaches the p-type base region 21 in the phototransistor parts 17a, 17b. When this happens, an optoelectric current produced at a pn junction between the p-type base region 21 and the n-type collector region (n-type monocrystalline Si layer) is amplified and taken out as a collector, emitter current.

This chain of signal propagation operations is carried out for each channel. That is, a first channel made up of the light emitting diode part 16a, the titanium oxide layer 27a and the phototransistor part 17a and a second channel made of the light emitting diode part 16b, the titanium oxide layer 27b and the phototransistor part 17b perform signal propagation independently. At this time, crosstalk between the channels is prevented by the SiO$_2$ layers 18a, 18b, 20a and 20b.

Thus in this preferred embodiment also, by the lower electrodes (ohmic electrode) 8 being disposed in positions displaced from directly below the upper electrodes 6 of the light emitting diode parts 16a, 16b, light is emitted from positions displaced from directly below the upper electrode 6 and this light is transmitted efficiently by the light waveguide paths (27a, 27b) almost without being influenced by attenuation due to the upper electrodes 6.

Besides phototransistors using Si, the light-receiving devices may alternatively be photodiodes, photothyristors, phototriacs or electromotive devices.

In FIG. 1, the p-Si diffusion layer 2 is not essential. That is, when device isolation is unnecessary or when it is not necessary to consider current channel control by depletion layers it can be made unnecessary. Also, in FIG. 1, the junction of the n-GaAs layer 4 and the n-Si diffusion layer 3 need not necessarily be made an ohmic junction and it is possible to form a light emitting region offset from directly below the upper electrode 6 without making it an ohmic junction.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor monocrystalline substrate having a first conductivity type region of a first conductivity type which becomes a current channel forming region;
   a first semiconductor layer of said first conductivity type made of a material different from that of said semiconductor monocrystalline substrate and so disposed on said semiconductor monocrystalline substrate as to be in contact with both said first conductivity type region and another region of said semiconductor monocrystalline substrate;
   a second semiconductor layer of a second conductivity type made of the same material as said first semiconductor layer and disposed on said first semiconductor layer, said first semiconductor layer and said second semiconductor layer forming an active region for emitting light; and
   an electrode disposed on an upper surface of said second semiconductor layer above said other region of said semiconductor monocrystalline substrate where said first conductivity type region is not provided,
   wherein a potential for extending a depletion layer toward a side of said first semiconductor layer is applied to said other region of said semiconductor monocrystalline substrate where said first conductivity type region is not provided.

2. A semiconductor device according to claim 1, wherein a junction surface between said first conductivity type region of said semiconductor monocrystalline substrate and said first semiconductor layer has an ohmic characteristic.

3. A semiconductor device according to claim 1, wherein said semiconductor monocrystalline substrate is made of silicon (Si) and a carrier concentration of said first conductivity type region is $1\times10^{20}$ cm$^{-3}$ or more and said first semiconductor layer is made of Gallium Arsenide (GaAs) and has a carrier concentration of $1\times10^{17}$ cm$^{-3}$ or more.

4. A semiconductor device according to claim 1, wherein a second conductivity type region of said second conductivity type is formed in said semiconductor monocrystalline substrate, said first conductivity type region is formed inside said second conductivity type region, said second conductivity type region is in contact with said first semiconductor layer and said electrode is disposed above a contact region between said second conductivity type region and said first semiconductor layer.

5. A semiconductor device comprising:
   a first semiconductor region of a first conductivity type;
   a second semiconductor region of a second conductivity type disposed so as to form a pn junction interface between said second semiconductor region and said first semiconductor region;
   a first electrode making ohmic contact with a first region of a surface of said first semiconductor region on the opposite side thereof from said pn junction interface;

a second electrode contacting with a second region of said surface of said first semiconductor region on the opposite side thereof from said pn junction interface to which is applied a potential for forming a depletion layer from said second region to inside said first semiconductor region, wherein said first region and said second region share said surface of said first semiconductor region on the opposite side thereof from said pn junction interface; and a third electrode so disposed on a surface of said second semiconductor region on the opposite side thereof from said pn junction interface as to face said second region of said first semiconductor region and contact with said second semiconductor region, wherein, when a voltage forward biasing said pn junction interface between said first semiconductor region and said second semiconductor region is applied between said first electrode and said third electrode, light is emitted from said pn junction interface.

6. A semiconductor device according to claim 5, wherein said third electrode is only disposed on said surface of said second semiconductor region on the opposite side thereof from said pn junction interface in a position facing said second region of said first semiconductor region.

7. A semiconductor device according to claim 5, wherein said first electrode comprises a third semiconductor region of the first conductivity type contacting with said first region of said first semiconductor region and a first metal electrode making ohmic contact with said third semiconductor region.

8. A semiconductor device according to claim 7, wherein said second electrode comprises a fourth semiconductor region of the second conductivity type and forms a pn junction between said second electrode and said second region of said first semiconductor region, said potential applied to said second electrode reverse biases said pn junction between said second electrode and said second region of said first semiconductor region.

9. A semiconductor device according to claim 5, wherein said depletion layer formed from said second region to inside said first semiconductor region when said potential is applied to said second electrode is thicker than a depletion layer when said potential is not applied.

10. A semiconductor device according to claim 8, wherein said potential applied to said second electrode is so determined as to reverse bias said pn junction between said fourth semiconductor region and said first semiconductor region in association with said voltage applied to forward bias said pn junction interface between said first semiconductor region and said second semiconductor region.

11. A semiconductor device according to claim 8, wherein said second electrode further comprises a second metal electrode making ohmic contact with said fourth semiconductor region and said second metal electrode is applied at the same potential as said first metal electrode.

12. A semiconductor device according to claim 8, wherein said third semiconductor region is a diffusion layer diffused at a surface of said fourth semiconductor region and said first and second regions of said first semiconductor region make contact with said third semiconductor region and said fourth semiconductor region, respectively.

13. A semiconductor device according to claim 12, wherein said first semiconductor region is composed of a different semiconductor material from said third and fourth semiconductor regions.

14. A semiconductor device according to claim 13, wherein said first semiconductor region is of GaAs of an impurity concentration of $1\times10^{17}$ cm$^{-3}$ or more and said third semiconductor region is of Si of an impurity concentration of $1\times10^{20}$ cm$^{-3}$ or more.

15. A semiconductor device according to claim 5, wherein, by extending said depletion layer to a side of said first semiconductor region, said second electrode routes a current channel constituted by said third electrode, said second semiconductor region, said first semiconductor region and said first electrode through a position in said pn junction interface between said second semiconductor region and said first semiconductor region corresponding to said first region.

\* \* \* \* \*